(12) United States Patent
Yang et al.

(10) Patent No.: US 11,169,219 B2
(45) Date of Patent: Nov. 9, 2021

(54) BUS SHORT-CIRCUIT DETECTION METHOD AND CIRCUIT, STORAGE MEDIUM AND PROCESSOR

(71) Applicants: GREE ELECTRIC APPLIANCES (WUHAN) CO., LTD, Wuhan (CN); GREE ELECTRIC APPLIANCES, INC. OF ZHUHAI, Zhuhai (CN)

(72) Inventors: Jian Yang, Zhuhai (CN); Biao Dai, Zhuhai (CN); Xiaomeng Zhu, Zhuhai (CN); Ai Song, Zhuhai (CN); Haisong Cheng, Zhuhai (CN)

(73) Assignees: GREE ELECTRIC APPLIANCES (WUHAN) CO., LTD, Wuhan (CN); GREE ELECTRIC APPLIANCES, INC. OF ZHUHAI, Zhuhai (CN)

(*) Notice: Subject to any disclaimer, the term of this patent is extended or adjusted under 35 U.S.C. 154(b) by 12 days.

(21) Appl. No.: 16/643,944

(22) PCT Filed: Aug. 13, 2018

(86) PCT No.: PCT/CN2018/100219
§ 371 (c)(1),
(2) Date: Mar. 3, 2020

(87) PCT Pub. No.: WO2019/100767
PCT Pub. Date: May 31, 2019

(65) Prior Publication Data
US 2020/0408851 A1  Dec. 31, 2020

(30) Foreign Application Priority Data

Nov. 22, 2017  (CN) .......................... 201711181466.6

(51) Int. Cl.
*G01R 31/52* (2020.01)
*H02H 3/08* (2006.01)
(Continued)

(52) U.S. Cl.
CPC .............. *G01R 31/52* (2020.01); *H02H 3/08* (2013.01); *H02H 9/02* (2013.01); *G01R 31/12* (2013.01);
(Continued)

(58) Field of Classification Search
CPC ........ G01R 31/52; G01R 31/12; G01R 31/36; G01R 31/3606; G01R 31/327; H02H 3/08;
(Continued)

(56) References Cited

U.S. PATENT DOCUMENTS

2010/0080022 A1* 4/2010 Schmidt ................ H02M 7/062
363/53
2015/0035539 A1* 2/2015 Wakida .................. B60L 3/003
324/418

FOREIGN PATENT DOCUMENTS

| CN | 1306330 A | 8/2001 |
| CN | 102156243 A | 8/2011 |

(Continued)

OTHER PUBLICATIONS

International Search Report for corresponding PCT/CN2018/100219, dated Nov. 2, 2018, 2 pages.

*Primary Examiner* — Danny Nguyen
(74) *Attorney, Agent, or Firm* — Armstrong Teasdale LLP

(57) ABSTRACT

Disclosed is a bus short-circuit detection method and circuit, a storage medium and a processor. The method includes that: a weak electricity charge circuit is started in a case that a strong voltage detection circuit detects that a bus voltage of a unit is abnormal before the bus voltage is charged, wherein the weak electricity charge circuit is configured to charge the bus; charge current variation of the weak electricity charge
(Continued)

circuit is detected; and a pre-charge circuit is started in a case that the charge current variation indicates that the bus is not in a short-circuited.

20 Claims, 3 Drawing Sheets

(51) Int. Cl.
*H02H 9/02* (2006.01)
*H02M 1/36* (2007.01)
*H02H 7/125* (2006.01)
*G01R 31/36* (2020.01)
*G01R 31/12* (2020.01)

(52) U.S. Cl.
CPC ............. *G01R 31/36* (2013.01); *H02H 7/125* (2013.01); *H02M 1/36* (2013.01)

(58) Field of Classification Search
CPC . H02H 9/02; H02H 7/125; H02M 1/36; H02J 7/0081; H02J 7/345
USPC .................................. 361/86–87, 93.7–93.9
See application file for complete search history.

(56) References Cited

FOREIGN PATENT DOCUMENTS

| CN | 105044529 A | 11/2015 |
| CN | 108008235 A | 5/2018 |

\* cited by examiner

BUS SHORT-CIRCUIT DETECTION METHOD AND CIRCUIT, STORAGE MEDIUM AND PROCESSOR

CROSS-REFERENCE TO RELATED APPLICATIONS

The present disclosure is a national stage entry of International Application No. PCT/CN2018/100219, which claims priority to Chinese Patent Application No. 201711181466.6, entitled "Bus Short-Circuit Detection Method and Circuit, Storage Medium and Processor", filed Nov. 22, 2017, the contents of which are hereby incorporated by reference in their entirety.

TECHNICAL FIELD

The present disclosure relates to the field of circuit, in particular to a bus short-circuit detection method and circuit, a storage medium and a processor.

BACKGROUND

In the current power circuit, a bus is often short-circuited since that the power device is damaged or enters a foreign body, at the point, the current bus voltage value is generally collected to determine whether the bus is in a short-circuited state. When the strong circuit is powered on for the first time or powered on again with a strong current, the bus is zero, whether a rear end is in the short-circuited state can only be judged through a strong voltage pre-charge circuit. However, this design has a disadvantage, that is, when a strong voltage is in a wide range, considering the cause of short circuit, the pre-charge circuit is subjected to various restrictions, which degrades an operational performance of the circuit; and when the back end is in the short-circuited state at high voltage, a back end impulse current is too large, which causes secondary damage to a back-end circuit to even fire, at the same time, causes the pre-charge circuit to heat seriously, so the service life of the pre-charge circuit is reduced.

Aiming at the above problem, an effective solution has not been proposed yet.

SUMMARY

According to an aspect of the embodiments of the present disclosure, a bus short-circuit detection method is provided. The method include that: a weak electricity charge circuit is started in a case that a strong voltage detection circuit has detected that a bus voltage of a unit is abnormal before the bus voltage is charged, and the weak electricity charge circuit is configured to charge the bus; a charge current variation of the weak electricity charge circuit is detected; and a pre-charge circuit is started in a case that the charge current variation indicates that the bus is not in a short-circuited state.

In some embodiments, the operation that the charge current variation of the weak electricity charge circuit is detected include that: it is detected that whether a charge current variation of a charge current of the weak current charge circuit indicates the charge current is constant or decreases gradually; and when the charge current variation indicates that the charge current of the weak electricity charge circuit is constant, it is determined that the bus is in the short-circuited state; and when the charge current variation indicates that the charge current of the weak electricity charge circuit decreases gradually, it is determined that the bus is not in the short-circuited state.

In some embodiments, before the weak electricity charge circuit is started, the method further includes that: it is determined whether the bus voltage detected by the strong voltage detection circuit is greater than a preset value; when the bus voltage detected by the strong voltage detection circuit is greater than the preset value, it is determined that the bus voltage is normal; when the bus voltage detected by the strong voltage detection circuit is less than the preset value, it is determined that the bus voltage is abnormal.

In some embodiments, after it is determined that the bus voltage is normal, the method further includes that: the weak electricity charge circuit is broken, and the pre-charge circuit is started.

In some embodiments, the unit is shut down in a case that the charge current variation indicates that the bus is in the short-circuited state.

According to an aspect of the embodiments of the present disclosure, a bus short-circuit detection circuit is provided. The circuit include: a strong voltage detection circuit, which is configured to detect whether a bus voltage of a unit is abnormal before the bus voltage is charged; a weak electricity charge circuit, which is connected with the strong voltage detection circuit, and is configured to charge the bus in a case that the strong voltage detection circuit has detected that the bus voltage of the unit is abnormal; a weak charge current detection circuit, which is connected with the weak electricity charge circuit, and is configured to detect a charge current variation of the weak electricity charge circuit; and a pre-charge circuit, which is respectively connected with the strong voltage detection circuit and the weak electricity charge circuit, and is configured to start in a case that the charge current variation of the weak electricity charge circuit indicates that the bus is not in a short-circuited state.

In some embodiments, the weak electricity charge circuit includes: a switch K3; a current-limiting resistor R3, which is connected with the switch K3 and is configured to control charging time period of the weak electricity charge circuit; and a charge power supply, the charge power supply is a voltage source or a constant current source.

In some embodiments, the weak charge current detection circuit includes: a current sensor L1, which is connected between the switch K3 and the current-limiting resistor R3; and a peripheral circuit, which is connected with the current sensor L1 in series.

In some embodiments, the strong voltage detection circuit includes: a resistor R4; a resistor R5, which is connected with the resistor R4 in series; a capacitor C2, which is connected with the resistor R5 in parallel. A branch consists of the resistor R4 and the resistor R5, one end of the branch is connected with one end of a bus capacitor, the other end of the branch is connected with the other end of the bus capacitor, and the branch is configured to detect a voltage of the bus capacitor.

In some embodiments, the pre-charge circuit includes: a switch K1; a switch K2; and a resistor R1, which is connected the switch K2 in series. A branch consists of the switch K2 and the resistor R1, one end of the branch is connected with one end of the switch K1 and the other end of the branch is connected with the other end of the switch K1.

According to an aspect of the embodiments of the present disclosure, a storage medium is provided. The storage medium includes a stored program. The program executes the bus short-circuit detection method.

According to an aspect of the embodiments of the present disclosure, a processor is also provided. The processor is used for running a program. The program executes the bus short-circuit detection method.

BRIEF DESCRIPTION OF THE DRAWINGS

The accompanying drawings described here are used for providing further understanding of the present disclosure, and constitute a part of the present application. Schematic embodiments of the present disclosure and description thereof are used for illustrating the present disclosure and not intended to form an improper limit to the present disclosure. In the accompanying drawings.

DETAILED DESCRIPTION OF THE EMBODIMENTS

In order to make those skilled in the art understand the solutions of the present disclosure better, the technical solutions in the embodiments of the present disclosure are clearly and completely elaborated below in combination with the accompanying drawings. It is apparent that the described embodiments are only a part of the embodiments of the present disclosure but not all. Based on the embodiments of the present disclosure, all the other embodiments obtained by those of ordinary skill in the art on the premise of not contributing creative effort should belong to the protection scope of the present disclosure.

It is to be noted that the terms like "first" and "second" in the specification, claims and accompanying drawings of the present disclosure are used for differentiating the similar objects, but do not have to describe a specific order or a sequence. It should be understood that the objects may be exchanged under appropriate circumstances, so that the embodiments of the present disclosure described here may be implemented in an order different from that described or shown here. In addition, terms "include" and "have" and any variations thereof are intended to cover non-exclusive inclusions. For example, it is not limited for processes, methods, systems, products or devices containing a series of steps or units to clearly list those steps or units, and other steps or units which are not clearly listed or are inherent to these processes, methods, products or devices may be included instead.

Figure 1:
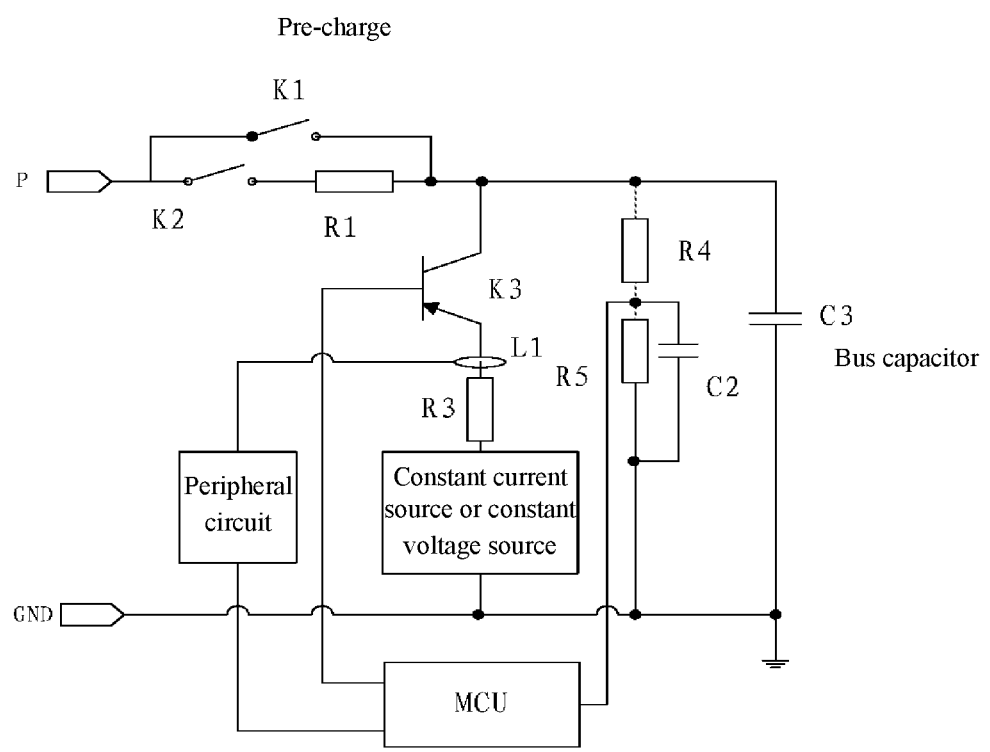
FIG. 1 shows a circuit diagram of a bus short-circuit detection circuit according to an embodiment of the present disclosure.

The embodiments of the disclosure provide a bus short-circuit detection circuit. FIG. 1 is a circuit diagram of the bus short-circuit detection circuit according to embodiments of the present disclosure. As shown in FIG. 1, the bus short-circuit detection circuit includes a strong voltage detection circuit, a weak electricity charge circuit, a weak charge current detection circuit and a pre-charge circuit.

The strong voltage detection circuit is configured to detect whether a bus voltage of a unit is abnormal before the bus voltage is charged.

The weak electricity charge circuit is connected with the strong voltage detection circuit, and is configured to charge a bus when the strong voltage detection circuit detects that the bus voltage of the unit is abnormal.

The weak charge current detection circuit is connected with the weak electricity charge circuit, and is configured to detect a charge current variation of the weak electricity charge circuit.

The pre-charge circuit is respectively connected with the strong voltage detection circuit and the weak electricity charge circuit, and is configured to start in a case that the charge current variation of the weak electricity charge circuit indicates that the bus is not in a short-circuited state.

In the embodiments, the bus is charged through the weak electricity charge circuit in the case that abnormal bus voltage is detected, and whether the bus is in the short-circuited state is determined according to the charge current variation; if it is determined that the bus is not in the short-circuited state, the pre-charge circuit can be started normally, so that a rear-end circuit is protected from secondary damage and current shock in case of high voltage strong electricity short-circuit; in such a manner, the technical problem which is that a related detection circuit detects bus short-circuit to cause that the rear-end circuit is not safe is solved, at the same time, a design margin of the pre-charge circuit is reduced.

Optionally, the weak electricity charge circuit includes: a switch K3; a current-limiting resistor R3, which is connected with the switch K3 and is configured to control charging time period of the weak electricity charge circuit; and a charge power supply. The charge power supply is a voltage source or a constant current source. The current-limiting resistor R3 can also function in limiting current.

Optionally, the weak charge current detection circuit includes: a current sensor L1, which is connected between the switch K3 and the current-limiting resistor R3; and a peripheral circuit, which is connected with the current sensor L1 in series.

Optionally, the strong voltage detection circuit includes: a resistor R4; a resistor R5, which is connected with the resistor R4 in series; a capacitor C2, which is connected with the resistor R5 in parallel. A branch consists of the resistor R4 and the resistor R5, one end of the branch is connected with one end of a bus capacitor, the other end of the branch is connected with the other end of the bus capacitor, and the branch is configured to detect a voltage of the bus capacitor.

Optionally, the pre-charge circuit includes: a switch K1, a switch K2; and a resistor R1, which is connected the switch K2 in series. A branch consists of the switch K2 and the resistor R1, one end of the branch is connected with one end of the switch K1 and the other end of the branch is connected with the other end of the switch K1.

As shown in FIG. 1, in the circuit diagram, the switch K1, the switch K2 and the resistor R1 form the pre-charge circuit. Before the pre-charge circuit works, It is detected whether the value of the current bus capacitor C3 is greater than a certain set value through the resistor R4 and the resistor R5 in the circuit (which may also be a voltage detection circuit consisting of other circuits); the capacitor C2 functions in filtering; if the value of the current bus capacitor C3 is greater than a certain set value, the bus is normal, and the pre-charge circuit works normally; if the value of the current bus capacitor C3 is less than the certain set value, the weak electricity charge circuit is started, and the weak electricity charge circuit consists of the switch K3, the resistor R3 and the voltage source or the constant current source. The switch K3 can be either a power tube or a relay, and plays a role of switch. The resistor R3 functions in limiting the current and controlling weak electricity charge time. The voltage source or the constant current source is the charge power supply (the circuit of the part can also form the weak electricity charge circuit by other circuits). After a certain period of time, the charge current variation at this point is detected through the weak charge current detection circuit, and the weak charge current detection circuit consists of the current sensor L1 and the peripheral circuit (which can also be the weak charge current detection circuit consisting of other circuits). If the charge current variation does not reach a preset value, it is determined that charging is failed, and the unit stops working; if the charge current variation reaches the preset value, the weak electricity charge circuit is broken, the pre-charge circuit is started, and the unit work normally. Before the strong electricity is powered on, by determining whether the bus is in the short-circuited state through the weak electricity charge circuit and the weak charge current detection circuit, and breaking the weak charge current detection circuit and closing the strong electricity in the case that no short circuit is detected, the circuit prevents a strong impulse current from causing secondary damage to the back-end circuit, and avoids an increased margin in designing the pre-charge circuit due to considering the short circuit problem of the bus, so the cost is saved, and the volume of the pre-charge circuit is reduced. A constant voltage source or a constant current source can be applied to supplying power for other circuits after pre-charge detection is completed. The circuit shown in FIG. 1 is only used for illustrating the principles of detecting bus short-circuit and opening circuit in the embodiment; the embodiment is not limited to the circuit shown in FIG. 1, and the specific circuit can be adjusted according to the actual application.

According to the embodiments of the present disclosure, some method embodiments of the bus short-circuit detection method are provided. It is to be noted that these steps presented in the flowchart of the accompanying drawings can be executed in a computer system like a group of computer executable instructions, and moreover, although a logical sequence is shown in the flowchart, in some cases, the presented or described steps can be performed in a sequence different from that described here.

Figure 2:
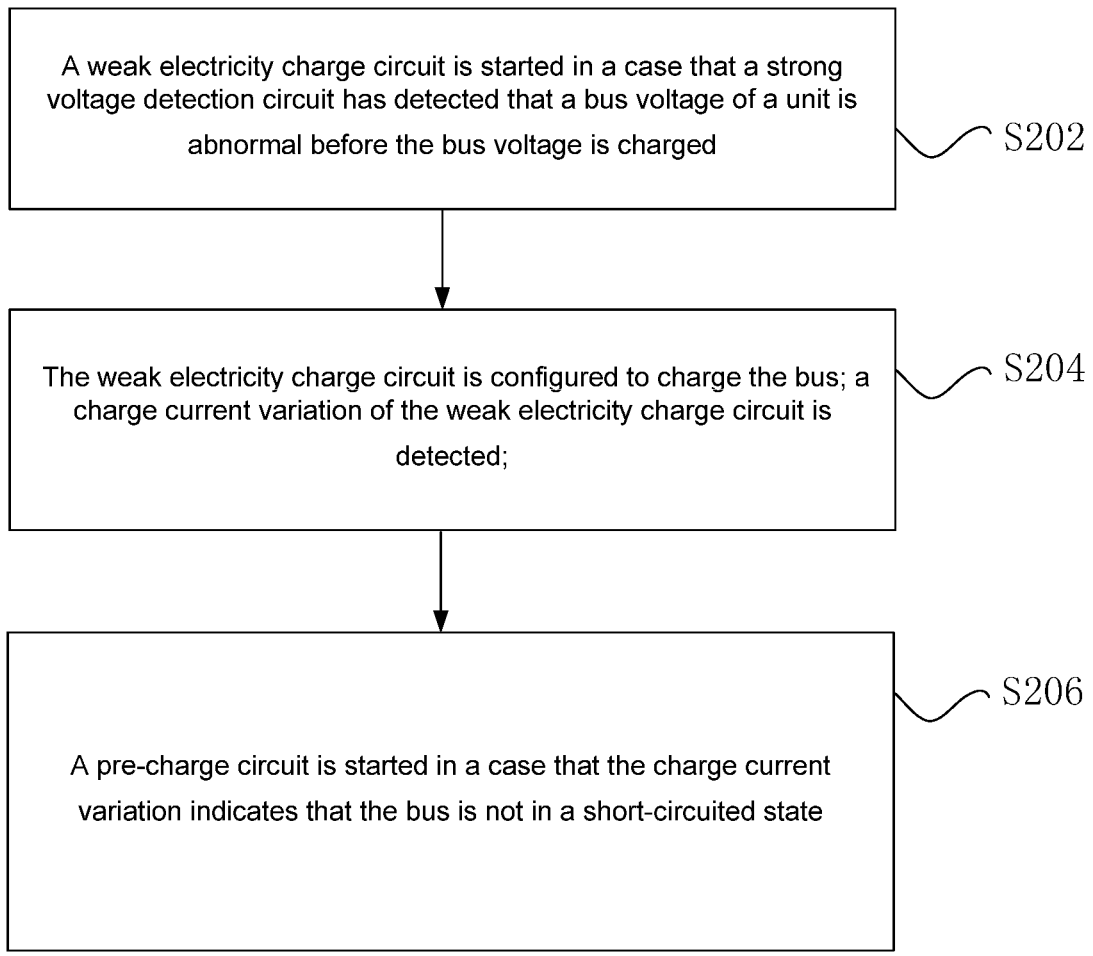
FIG. 2 shows a flowchart of a bus short-circuit detection method according to an embodiment of the present disclosure.

FIG. 2 shows a flowchart of the bus short-circuit detection method according to some embodiments of the present disclosure. As shown in FIG. 2, the method include the following steps.

At S202, the weak electricity charge circuit is started in a case that the strong voltage detection circuit detects that the bus voltage of the unit is abnormal before the bus voltage is charged, the weak electricity charge circuit is configured to charge the bus.

When the bus voltage is detected before the bus voltage is charged, it can be determined whether the bus voltage detected by the strong voltage detection circuit is greater than a preset value; if the bus voltage detected by the strong voltage detection circuit is greater than the preset value, it is determined that the bus voltage is normal; if the bus voltage detected by the strong voltage detection circuit is less than the preset value, it is determined that the bus voltage is abnormal.

In the case that the bus voltage is greater than the preset value, it is determined that the bus voltage is normal and can supply power for the unit. In the case that the bus voltage is less than the preset value, the bus voltage is abnormal and may be short-circuited. In this case, the weak electricity charge circuit is started to charge the bus capacitor. Charging through the weak electricity charge circuit prevents the circuit from being damaged by the strong voltage.

At S204, the charge current variation of the weak electricity charge circuit is detected. The charge current variation of the weak electricity charge circuit with a period of time is detected. If the charge current variation does not change over time, and it is the constant current, it is determined that the bus is in the short-circuited state. If the charge current variation gradually decreases over time, it is determined that the bus is normal. That is, it is detected that the charge current variation of the weak electricity charge circuit to indicate whether the charging current is constant or decreases gradually; when the charge current variation indicates that the current of the weak electricity charge circuit is constant, it is determined that the bus is in the short-circuited state; and when the charge current variation indicates that the current of the weak electricity charge circuit decreases gradually, it is determined that the bus is not in a short-circuited state.

At S206, the pre-charge circuit is started in the case that the charge current variation indicates that the bus is not in the short-circuited state.

Whether the bus is in the short-circuited state can be determined according to the charge current variation. If the bus is in the short-circuited state, it is necessary to stop the unit for detection; if the bus is not in the short-circuited state, the pre-charge circuit can be started.

In the embodiments, the bus is charged through the weak electricity charge circuit in the case that abnormal bus voltage is detected, and whether the bus is in the short-circuited state is determined according to the charge current variation; if it is determined that the bus is not in the short-circuited state, the pre-charge circuit can be started normally, so that a rear-end circuit is protected from secondary damage and current shock in case of high voltage strong electricity short-circuit; in such a manner, the technical problem which is that a related detection circuit detects bus short-circuit to cause that the rear-end circuit is not safe is solved, at the same time, a design margin of the pre-charge circuit is reduced.

Optionally, when it is determined that the bus is not in the short-circuited state, the weak electricity charge circuit is broken, and the pre-charge circuit is started. When the weak electricity charge circuit is not constant current, it is determined that the bus is in the short-circuited state, and in this case, the weak electricity charge circuit is no longer needed to charge, and then, the weak electricity charge circuit is broken, at the same time, the pre-charge circuit is started to start the unit.

Optionally, after the charge current variation of the weak electricity charge circuit is detected, if the charge current variation indicates that the bus is in the short-circuited state, the unit is shut down. Then it is detected that the unit has fault, and the fault is removed, the bus short-circuit detection method is performed again.

Figure 3:
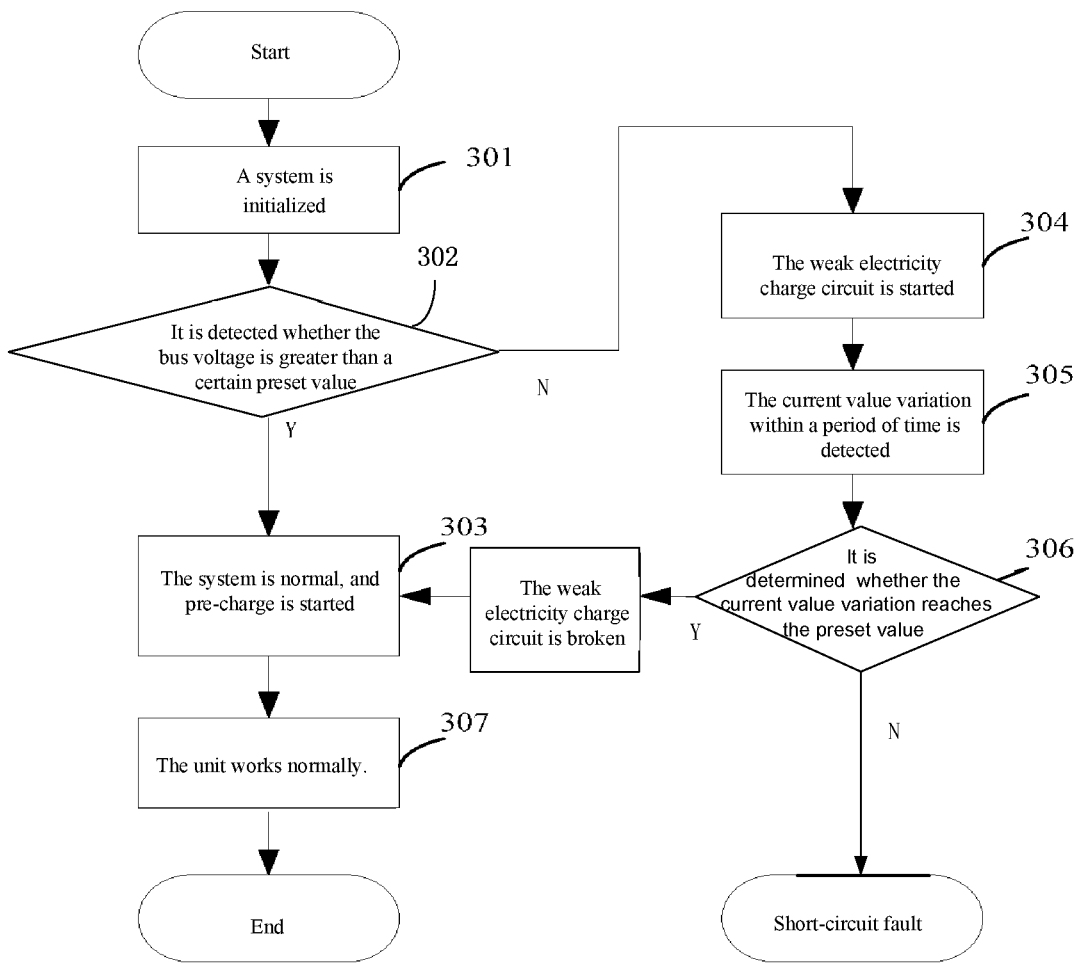
FIG. 3 shows a flowchart of a bus short-circuit detection method according to a preferred embodiment of the present disclosure.

The bus short-circuit detection method of the embodiment is described below referring to FIG. 3.

At S301, a system is initialized.

At S302, it is detected whether the bus voltage is greater than a certain preset value. If so, S303 is performed; or else, S304 is performed.

At S303, the system is normal, and pre-charge is started.

At S304, the weak electricity charge circuit is started.

At S305, the current value variation within a period of time is detected.

At S306, it is determined whether the current value variation reaches the preset value; if so, the weak electricity charge circuit is broken; or else, a short-circuit fault is determined. That is, it is determined whether the variation is always the set value; if so, it is determined that the weak electricity charge circuit is the constant current, and the bus is in the short-circuited state. If the variation is not always the set value, but gradually decreases, it is determined that the bus is not in the short-circuited state.

At S307, the unit works normally.

The embodiments of the present disclosure also provide a storage medium. The storage medium includes a stored program. The program executes the bus short-circuit detection method.

The embodiments of the present disclosure also provide a processor. The processor is used for running a program. The program executes, when running, the bus short-circuit detection method.

In the above embodiments of the disclosure, the descriptions of the embodiments focus on different aspects. A part which is not described in a certain embodiment in detail may refer to the related description of the other embodiments.

In the several embodiments provided in the application, it should be understood that the technical contents disclosed may be realized in other ways. The embodiment of the device described above is only schematic; for example, the division of the units is only a division of logical functions, and there may be other dividing modes during the actual implementation, for example, multiple units or components may be combined or integrated to another system, or some features may be ignored or are not executed. In addition, coupling, direct coupling, or communication connection shown or discussed may be implemented through indirect coupling or communication connection of some interfaces, units or modules, and may be in an electrical form or other forms.

The units described as separate parts may be or may not be separate physically. The part shown as the unit may be or may not be a physical unit, that is to say, it may be in a place or distributed on multiple network units. Part or all of the units may be selected to achieve the purpose of the solutions of the embodiments according to a practical requirement.

Moreover, all the function units in the embodiments of the disclosure may be integrated in a processing unit; or the units exist separately and physically; or two or more than two units are integrated in a unit. The integrated unit may be realized in form of hardware or in form of software function unit.

If the integrated unit is implemented by software function modules, and the software function modules are sold or used as independent products, they can also be stored in a computer readable storage medium. Based on this understanding, the technical solution of the embodiments of the present disclosure substantially or the part making a contribution to the conventional art can be embodied in the form of software product; the computer software product is stored in a storage medium, and includes a number of instructions to make a computer device (which may be a personal computer, a server or a network device, etc.) perform all or part of steps of the method in each embodiment of the present disclosure. The storage media include, but not limited to, a USB flash disk, a Read-Only Memory (ROM), a Random Access Memory (RAM), a mobile hard disk, a magnetic disk, a compact disc, and other media capable of storing the program codes.

The above is only the preferred embodiments of the disclosure; it should be indicated that, on the premise of not departing from the principles of the disclosure, those of ordinary skill in the art may also make a number of improvements and supplements, and these improvements and supplements should fall within the protection scope of the disclosure.

INDUSTRIAL APPLICABILITY

In the embodiments, the bus is charged through the weak electricity charge circuit in the case that abnormal bus voltage is detected before the bus voltage is charged, and whether the bus is in a short-circuited state is determined according to the charge current variation; if it is determined that the bus is not in the short-circuited state, the pre-charge circuit can be started normally, so that a rear-end circuit is protected from secondary damage and current shock in case of high voltage strong electricity short-circuit; in such a manner, the technical problem which is that a related detection circuit detects bus short-circuit to cause that the rear-end circuit is not safe is solved, at the same time, a design margin of the pre-charge circuit is reduced.

What is claimed is:

1. A bus short-circuit detection method, comprising:
    starting a weak electricity charge circuit in a case that a strong electricity voltage detection circuit has detected that a bus voltage of a unit is abnormal before the bus voltage is charged, wherein the weak electricity charge circuit is configured to charge the bus;
    detecting a charge current variation of the weak electricity charge circuit; and
    starting a pre-charge circuit in a case that the charge current variation indicates that the bus is not in a short-circuited state.

2. The method as claimed in claim 1, wherein detecting the charge current variation of the weak electricity charge circuit comprises:
    detecting whether a charge current variation of a charge current of the weak electricity charge circuit indicates the charge current is constant or decreases gradually;
    when the charge current variation indicates that the charge current of the weak electricity charge circuit is constant, determining that the bus is in the short-circuited state; and when the charge current variation indicates that the charge current of the weak electricity charge circuit decreases gradually, determining that the bus is not in the short-circuited state.

3. The method as claimed in claim 1, wherein before starting the weak electricity charge circuit, the method further comprises:
    determining whether the bus voltage detected by the strong voltage detection circuit is greater than a preset value;
    when the bus voltage detected by the strong voltage detection circuit is greater than the preset value, determining that the bus voltage is normal;
    when the bus voltage detected by the strong voltage detection circuit is less than the preset value, determining that the bus voltage is abnormal.

4. The method as claimed in claim 3, wherein after determining that the bus voltage is normal, the method further comprises:
    breaking the weak electricity charge circuit, and starting the pre-charge circuit.

5. The method as claimed in claim 1, wherein after detecting the charge current variation of the weak electricity charge circuit, the method further comprises:
    shutting down the unit in a case that the charge current variation indicates that the bus is in the short-circuited state.

6. A bus short-circuit detection circuit, comprising:
a strong voltage detection circuit, configured to detect whether a bus voltage of a unit is abnormal before the bus voltage is charged;
a weak electricity charge circuit, connected with the strong voltage detection circuit, and is configured to charge the bus in a case that the strong voltage detection circuit has detected that the bus voltage of the unit is abnormal;
a weak charge current detection circuit, connected with the weak electricity charge circuit, and is configured to detect a charge current variation of the weak electricity charge circuit; and
a pre-charge circuit, respectively connected with the strong voltage detection circuit and the weak electricity charge circuit, and is configured to start in a case that the charge current variation of the weak electricity charge circuit indicates that the bus is not in a short-circuited state.

7. The circuit as claimed in claim 6, wherein the weak electricity charge circuit comprises:
a switch K3;
a current-limiting resistor R3, connected with the switch K3 and is configured to control charging time period of the weak electricity charge circuit; and
a charge power supply, wherein the charge power supply is a voltage source or a constant current source.

8. The circuit as claimed in claim 7, wherein the weak charge current detection circuit comprises:
a current sensor L1, connected between the switch K3 and the current-limiting resistor R3; and
a peripheral circuit, connected with the current sensor L1 in series.

9. The circuit as claimed in claim 6, wherein the strong voltage detection circuit comprises:
a resistor R4;
a resistor R5, connected with the resistor R4 in series;
a capacitor C2, connected with the resistor R5 in parallel;
wherein a branch consists of the resistor R4 and the resistor R5, one end of the branch is connected with one end of a bus capacitor, the other end of the branch is connected with the other end of the bus capacitor, and the branch is configured to detect a voltage of the bus capacitor.

10. The circuit as claimed in claim 6, wherein the pre-charge circuit comprises:
a switch K1;
a switch K2; and
a resistor R1, connected the switch K2 in series;
wherein a branch consists of the switch K2 and the resistor R1, one end of the branch is connected with one end of the switch K1 and the other end of the branch is connected with the other end of the switch K1.

11. A non-transitory storage medium, comprising a stored program;
wherein the program executes a bus short-circuit detection method as claimed in claim 1.

12. A processor, being used for running a program; wherein the program executes, when running, a bus short-circuit detection method as claimed in claim 1.

13. A non-transitory storage medium, comprising a stored program; wherein the program executes a bus short-circuit detection method as claimed in claim 2.

14. A non-transitory storage medium, comprising a stored program; wherein the program executes a bus short-circuit detection method as claimed in claim 3.

15. A non-transitory storage medium, comprising a stored program; wherein the program executes a bus short-circuit detection method as claimed in claim 4.

16. A non-transitory storage medium, comprising a stored program; wherein the program executes a bus short-circuit detection method as claimed in claim 5.

17. A processor, being used for running a program; wherein the program executes, when running, a bus short-circuit detection method as claimed in of claim 2.

18. A processor, being used for running a program; wherein the program executes, when running, a bus short-circuit detection method as claimed in of claim 3.

19. A processor, being used for running a program; wherein the program executes, when running, a bus short-circuit detection method as claimed in of claim 4.

20. A processor, being used for running a program; wherein the program executes, when running, a bus short-circuit detection method as claimed in of claim 5.

* * * * *